United States Patent [19]

Murakami et al.

[11] Patent Number: 5,279,679
[45] Date of Patent: Jan. 18, 1994

[54] MULTI-LAYERED PHOTOVOLTAIC ELEMENT HAVING AT LEAST THREE UNIT CELLS

[75] Inventors: Tsutomu Murakami; Jinsho Matsuyama; Koichi Matsuda; Hiroshi Yamamoto; Toshihiro Yamashita, all of Nagahama, Japan

[73] Assignee: Canon Kabushiki Kaisha, Tokyo, Japan

[21] Appl. No.: 838,040

[22] Filed: Feb. 21, 1992

[30] Foreign Application Priority Data

Feb. 22, 1991 [JP] Japan .................. 3-48777

[51] Int. Cl.$^5$ .................. H01L 31/075; H01L 31/052
[52] U.S. Cl. .................. 136/246; 136/249
[58] Field of Search .................. 136/249TJ; 136/246

[56] References Cited

U.S. PATENT DOCUMENTS

| 2,949,498 | 8/1960 | Jackson | 136/244 |
| 4,271,328 | 6/1981 | Hamakawa et al. | 136/249 TJ |
| 4,272,641 | 6/1981 | Hanak | 136/249 TJ |
| 4,342,044 | 7/1982 | Ovshinsky et al. | 357/2 |
| 4,377,723 | 3/1983 | Dalal | 136/249 TJ |
| 4,379,943 | 4/1983 | Yang et al. | 136/249 TJ |
| 4,485,389 | 11/1984 | Ovshinsky et al. | 357/2 |
| 4,816,082 | 3/1989 | Guha et al. | 136/249 TJ |

FOREIGN PATENT DOCUMENTS 62-084571 9/1987 Japan .................. 136/249 TJ

OTHER PUBLICATIONS

"Amorphous-Silicon Solar Cells" by David E. Carlson; *IEEE Transactions on Electron Devices* 36, (1989) Dec., No. 12, New York; U.S.A. pp. 2775-2780.

"Status of Amorphous Thin Film Solar Cells" by S. R. Das; *Thin Solid Films*, 119, (1984) pp. 31-54.

*Primary Examiner*—Aaron Weisstuch
*Attorney, Agent, or Firm*—Fitzpatrick, Cella Harper & Scinto

[57] ABSTRACT

A multi-layered photovoltaic element obtained by stacking at least three cells for photovoltaic generation. A second cell formed adjacent to a light incident-side cell and adapted to receive light which has passed through the light incident-side cell includes an i-type semiconductor layer having a band gap falling within a range of 1.45 eV to 1.60 eV. The i-type semiconductor layer consists essentially of a silicon-germanium-containing amorphous material.

1 Claim, 9 Drawing Sheets

MIDDLE LAYER i-LAYER BANDGAP (eV)

MULTI-LAYERED PHOTOVOLTAIC ELEMENT HAVING AT LEAST THREE UNIT CELLS

BACKGROUND OF THE INVENTION

1. Field of the Invention

The present invention relates to a photovoltaic element such as a solar cell suitable as a power source for various electronic equipment or power supply plant and, more particularly, to a multi-layered photovoltaic element having a specific feature in its layer structure.

2. Related Background Art

Solar cells for converting sunlight into electric energy have received widespread use as a low-power source of, e.g., electronic calculators and wristwatches. Solar cells have received a great deal of attention as a practical future technique for generating power instead of so-called fossil fuels such as petroleum and coal. Solar cells utilize the photovoltaic effect of a p-n junction in a semiconductor. A semiconductor such as silicon absorbs sunlight to generate photocarriers, i.e. electrons and holes. The photocarriers drift under the influence of an internal electric field at the p-n junction, and then are extracted as electric energy.

One conventional method of forming such a solar cell uses a monocrystalline semiconductor process. More specifically, a monocrystalline silicon ingot whose valence band is controlled to exhibit p or n type behavior, is formed by a crystal growth method such as a CZ method. This monocrystalline silicon ingot is sliced to obtain silicon wafers each having a thickness of about 30 $\mu$m. A layer having a conductivity type opposite to that of the wafer is formed in the wafer by an appropriate means such as diffusion of a dopant impurity, thereby forming a p-n junction.

Monocrystalline silicon is used in state-of-the-art solar cells from the viewpoints of reliability and conversion efficiency. However, since a monocrystalline semiconductor process is used to manufacture the solar cell, cost is high.

Since a monocrystalline silicon solar cell has a disadvantage in that monocrystalline silicon is an indirect band gap semiconductor, its light-absorbing coefficient is small. In addition, since a monocrystalline solar cell absorbs incident sunlight, it must have a thickness of at least 50 $\mu$m. Since the band gap of the monocrystalline silicon is about 1.1 eV, which is lower than a potential of 1.5 V required as the electromotive force of the solar cell, long wavelength components of the sunlight cannot be effectively utilized.

A monocrystalline silicon wafer having a large area cannot be prepared because the silicon is crystalline. When a high power output is to be obtained, a plurality of unit elements must be connected in series or parallel with each other by means of a wiring operation. When a solar cell is used outdoors, an expensive installation must be provided to protect it from mechanical damage caused by various weather conditions. Cost performance with respect to the unit power generation amount is poorer than with conventional power generation methods.

Various studies have been made on such important technical problems as high cost and large cell size. Studies on low-cost materials and materials having a high conversion efficiency have also been made.

Examples of solar cell materials are tetrahedrally bonded non-monocrystalline silicon (e.g., amorphous silicon, amorphous silicon germanium, and amorphous silicon carbide), Group II-VI compound semiconductors (e.g., CdS), and Group III-V compound semiconductors (e.g., GaAs and GaAlAs). With all of them, a thin film solar cell using a non-monocrystalline semiconductor as a photovoltaic generating layer can have a larger area and a smaller thickness than that of a monocrystalline solar cell and can be deposited on an arbitrary substrate material. Therefore, the thin film solar cell is most promising.

Solar cells using the above non-monocrystalline semiconductors still have room for improvements of the photoelectric conversion efficiency and reliability as a power generating element.

A method for improving the photoelectric conversion efficiency of a solar cell using a non-monocrystalline semiconductor is to increase the sensitivity to light having a long wavelength by decreasing the band gap. That is, since amorphous silicon has a band gap of about 1.7 eV, light having a wavelength of about 700 nm or greater cannot be absorbed, and light cannot be effectively utilized. Studies on the use of a material sensitive to long-wavelength light and having a small band gap have been made. An example of such a material is amorphous silicon germanium, whose band gap can be easily changed from 1.3 eV to 1.7 eV by changing the ratio of a silicon source gas to a germanium source gas during film formation.

Use of a so-called tandem cell, i.e., a plurality of stacked solar cells each having a unit element structure, as disclosed in U.S. Pat. No. 2,949,498, is another method of improving conversion efficiency of a solar cell. A p-n junction crystalline semiconductor is used in the tandem cell. The sunlight spectrum is efficiently absorbed by photovoltaic elements having different band gaps, thereby increasing Voc and hence improving the power generation efficiency.

In the tandem cell, elements having different band gaps are stacked on each other to efficiently absorb components of the sunlight spectrum, thereby improving the conversion efficiency. The band gap of the so-called top cell located on the incident side of the multi-layered element is larger than that of the so-called bottom cell located below the top cell. A three-layered tandem cell (to be referred to as a triple cell hereinafter) having a middle cell sandwiched between the top and bottom cells has also been considered.

As a general combination of materials suitably and efficiently absorbing sunlight in the tandem cell, and particularly in the two-layered tandem cell, the top cell consists of amorphous silicon, and the bottom cell consists of amorphous silicon germanium. In a triple cell, the top and middle cells consist of amorphous silicon, and the bottom cell consists of amorphous silicon germanium.

In order to increase the sensitivity range of the triple cell, use of a material such as amorphous silicon carbide, which does not absorb long-wavelength light because of its band gap of 1.9 eV, is taken into consideration. A material having a large band gap is used as the top cell on the light incident side to absorb light components having relatively short wavelengths of the sunlight spectrum. A material having a smaller band gap is used as a middle cell, and a material having the smallest band gap is used as a bottom cell, thereby efficiently absorbing sunlight.

Conventional multi-layered photovoltaic elements described above are disclosed in, e.g., U.S. Pat. Nos.

4,271,328 (Hamakawa), 4,377,723 (Dalal), 4,816,082 (Guha et al.), 4,379,943 (Yang et al.), 4,342,044 (Ovshinsky et al.), 4,485,389 (Ovshinsky et al.), and 4,272,641 (Hanak).

Another problem of solar cells using an amorphous semiconductor is degradation of conversion efficiency upon light radiation. The film quality of amorphous silicon and amorphous silicon alloys is degraded upon light radiation, and mobility of the carriers is impaired, which is well known as the Staebler•Wronski effect. This phenomenon is unique to an amorphous semiconductor, and is not found in crystalline systems. When a solar cell is used as a power source, reliability is degraded, which may prevent practical applications of solar cells. Extensive studies have been made to reduce optical degradation of amorphous semiconductors. More specifically, prevention of optical degradation by improving film quality has been studied.

In the solar cell having the amorphous semiconductor layer described above, although studies for clarifying the mechanism of the optical degradation and prevention of the optical degradation continue, this problem has not been completely solved. Higher reliability is required in amorphous silicon solar cells.

SUMMARY OF THE INVENTION

It is a principal object of the present invention to provide a photovoltaic element which has high reliability, high photoelectric conversion efficiency over a long period of time, and a high output voltage.

It is another object of the present invention to provide a multi-layered photovoltaic element having three stacked pin photovoltaic elements, wherein an i-type semiconductor layer in the middle photovoltaic element consists essentially of an amorphous silicon germanium alloy semiconductor having a band gap falling within a range of 1.45 eV to 1.60 eV.

The present inventors have made extensive studies on a solar cell which overcomes the conventional problems described above, has little optical degradation, and has a high conversion efficiency. The present inventors have determined the following: When a material having a small band gap is used as a middle cell in a triple cell, the initial efficiency is improved. In addition, when the band gap of the material used as the middle cell is appropriately controlled, a solar cell which is stable with respect to light radiation is obtained. Further extensive studies have been made on the basis of the above findings to achieve the present invention by applying it to a photovoltaic element.

In the conventional triple cell described above, maximum efficiency of the cell cannot be obtained unless current matching for equalizing the amounts of current obtained by the respective cells is not performed. However, the band gap obtained by use of amorphous silicon in the middle cell is almost equal to that of the top cell. An i layer serving as a light-absorbing layer must then be made thick to have sufficient light absorption. Therefore, the thickness of the i layer of the middle cell is made larger than that of the top cell or the bottom cell. For this reason, although degradation is difficult to occur in the top cell or the bottom cell due to the small thickness of the corresponding i layer, the middle cell tends to be easily degraded. As a result, the conversion efficiency of the overall stacked cell is limited by that of the cell having poor efficiency, and the cell is easily degraded. A solar cell which simultaneously satisfies high reliability and high conversion efficiency cannot therefore be realized by improving only the film quality of each layer.

As opposed to the conventional technical concept for preventing degradation of the photoelectric conversion efficiency by improving film quality, the present invention prevents degradation of the photoelectric conversion efficiency by an optimal combination of semiconductor materials of a multi-layered cell.

DETAILED DESCRIPTION OF THE PREFERRED EMBODIMENTS

Preferred embodiments of the present invention will be described with reference to the accompanying drawings.

The present invention, however, is not limited to these embodiments. Various changes and modifications may be made within the spirit and scope of the present invention.

A preferred embodiment of the present invention provides a multi-layered photovoltaic element having at least three stacked pin photovoltaic elements to obtain a photovoltaic element having a high initial conversion efficiency and a high conversion efficiency after degradation, wherein a i-type semiconductor layer 114 as the second layer from the light incident side of the photovoltaic element consists of an amorphous material having a band gap falling within the range of 1.45 eV to 1.60 eV.

Figure 1:
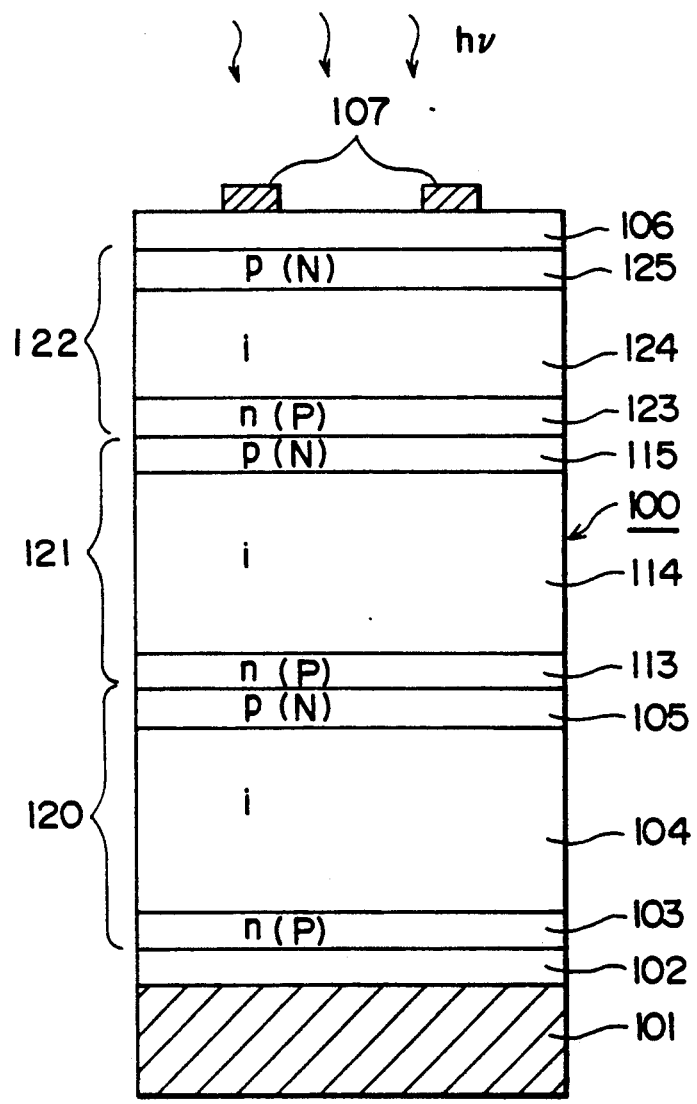
FIG. 1 is a sectional view illustrating a structure of a photovoltaic element according to an embodiment of the present invention.
Figure 2:
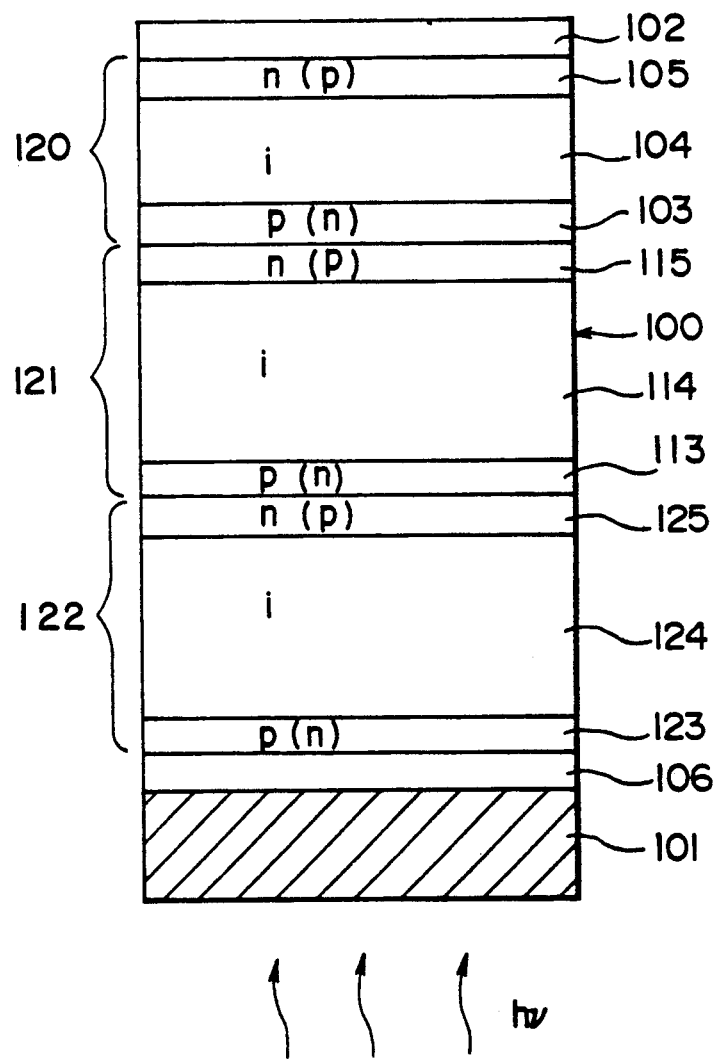
FIG. 2 is a sectional view illustrating a structure of a photovoltaic element according to another embodiment of the present invention.

FIGS. 1 and 2 show pin amorphous solar cells as photovoltaic elements according to the present invention. FIG. 1 shows a solar cell 100 on which light is incident downwardly. This solar cell comprises a bottom cell 120, a middle cell 121, a top cell 122, a substrate 101, a lower electrode 102, n-type semiconductor layers 103, 113, and 123, i-type semiconductor layers 104, 114, and 124, p-type semiconductor layers 105, 115, and 125, a transparent upper electrode 106, and collector electrodes 107.

In the illustrated photovoltaic element, the stacking order of the n- and p-type semiconductor layers may be reversed in accordance with the application purpose. FIG. 2 shows a solar cell having a structure in which light is incident upwardly from a transparent substrate 101. In this structure, the light incident direction is opposite to that of the solar cell in FIG. 1. An arrangement of each of these photovoltaic elements will be described below.

Substrate

At the semiconductor layer is a thin film having a maximum thickness of about 1 μm, deposited on an appropriate substrate serving as a support. The substrate 101 may be monocrystalline or non-monocrystalline or conductive or electrically insulative. The substrate 101 may also be transparent or nontransparent. The substrate 101 is preferably a substrate which is hardly deformed or distorted and which has a desired strength. Examples of the substrate are: a thin plate or a composite body of a metal (e.g., Fe, Ni, Cr, Al, Mo, Au, Nb, Ta, V, Ti, Pt, or Pb) or an alloy thereof (e.g., brass or stainless steel); a film or sheet of a heat-resistive synthetic resin (e.g., polyester, polyethylene, polycarbonate, cellulose acetate, polypropylene, polyvinyl chloride, polyvinylidene chloride, polystyrene, polyamide, polyimide, or epoxy) or a composite body of the heat-resistive synthetic resin and a fiber (e.g., a glass fiber, a carbon fiber, a boron fiber, or a metal fiber); a material obtained by coating a metal thin film made of a different metal from that of the above metal thin plate or the resin sheet, and/or an insulating thin film (e.g., $SiO_2$, $Si_3N_4$, $Al_2O_3$, or AlN) formed on the surface of the metal plate or the resin sheet by sputtering, vapor deposition, or plating; glass; and a ceramic.

When the above described substrate is made of a strip-shaped electrically conductive material such as a metal, the substrate can be directly used as a current output electrode. However, if the substrate is made of an electrically insulating material such as a synthetic resin, a metal or alloy (e.g., Al, Ag, Pt, Au, Ni, Ti, Mo, W, Fe, V, Cr, Cu, stainless steel, brass, or nichrome) a transparent conductive oxide (TCO) (e.g., $SnO_2$, $In_2O_3$, ZnO, or ITO) may be preferably formed as a current output electrode in advance by plating, vacuum deposition, or sputtering after the substrate is surface-treated.

Even if the strip-shaped substrate is made of an electrically conductive material such as a metal, a metal layer consisting of a material different from that of the substrate may be formed on the film deposition surface of the substrate to increase the reflectance on the surface of the substrate for light having a long wavelength and prevent diffusion of constituent elements between the substrate material and the deposition film material. When the substrate is relatively transparent and a solar cell having a layer structure for allowing light incidence from the substrate side is to be formed, a conductive thin film such as a transparent conductive oxide or a metal thin film is preferably formed on the substrate in advance.

The surface of the substrate may be smooth or slightly roughened. If the substrate has a slightly rough surface, the surface pattern has a spherical, conical, or pyramidal shape. The surface pattern preferably has a maximum height ($R_{max}$) falling within the range of 500 Å to 5,000 Å to cause irregular reflection at the surface, thereby increasing the optical path length of the reflected light. The substrate may have the shape of a plate, an elongated belt, a cylinder, or the like having a smooth or slightly rough surface. The thickness of the substrate is selected so as to form a desired photovoltaic element. In this case, if flexibility is required for the photovoltaic element, or if light incidence from the substrate side is required, the substrate should have a minimum thickness to assure the substrate function. However, the thickness of the substrate generally falls within the range of 10 μm or greater in view of fabrication convenience, handling, and mechanical strength.

Electrodes

In the photovoltaic element according to the present invention, appropriate electrodes are selected and used in accordance with the arrangement of the element. These electrodes include a lower electrode, an upper electrode (transparent electrode), and a collector electrode (note that the upper electrode is defined as an electrode formed on the light incident side, and the lower electrode is defined as a counter electrode opposite to the upper electrode so as to sandwich a semiconductor layer therebetween). These electrodes will be described in detail below.

Lower Electrode

The position of the lower electrode 102 used in the present invention is changed depending on whether the substrate 101 is made of a transparent material and which surface is accordingly irradiated with light for generating a photovoltaic force (for example, if the substrate 101 is made of a non-transparent material such as a metal, the light for generating photovoltaic power is radiated on the upper electrode 106, as shown in FIG. 1).

More specifically, in the layer structure shown in FIG. 1, the lower electrode is formed between the substrate 101 and the n-type semiconductor layer 103. However, if the substrate 101 is conductive, the substrate also serves as the lower electrode. Note that even if the substrate 101 is conductive, if its sheet resistance is high, the electrode 102 may be formed to be a current outputting low-resistance electrode or to increase the reflectance of the substrate surface and efficiently utilize the incident light.

In the structure shown in FIG. 2, since the transparent substrate 101 is used, light is incident from the side of the substrate 101. A lower electrode 102 is formed to sandwich a semiconductor layer with the substrate 101 to output a current and reflect light from the lower electrode.

When the substrate 101 comprises an electrically insulating substrate, the lower electrode 102 as a current output electrode is formed between the substrate 101 and the n-type semiconductor layer 103.

Examples of the electrode are a metal (e.g. Ag, Au, Pt, Ni, Cr, Cu, Al, Ti, Zn, Mo, or W) or an alloy thereof. Such a material is deposited to form a thin film by vacuum deposition, electron beam deposition, or sputtering. The metal thin film should not serve as a resistive component to the output from the photovoltaic element. The metal film has a sheet resistance of preferably 50 Ω/□ or less and more preferably 10 Ω/□ or less.

A diffusion barrier layer (not shown) such as a conductive zinc oxide film may be formed between lower electrode 102 and the n-type semiconductor layer 103. The effects of the diffusion barrier layer are as follows.

This layer prevents the metal element constituting the lower electrode 102 from being diffused into the n-type semiconductor layer. The diffusion barrier layer has a low resistance to prevent a short circuit caused by a defect such as a pinhole between the lower electrode 102 and the transparent electrode 106 which sandwich the semiconductor layer therebetween. The diffusion barrier layer causes the thin film to generate multiple light interference, thereby confining the incident light within the photovoltaic element.

Upper Electrode (Transparent Electrode)

The transparent electrode 106 used in the present invention preferably has a transmittance of 85% or more to efficiently absorb light from the sun or a white fluorescent lamp in the semiconductor layer. The transparent electrode 106 preferably has a sheet resistance of 100 Ω/□ or less so as to prevent the transparent electrode from serving as a resistive component for the output from the photovoltaic element. Examples of the material having the above properties are a metal oxide (e.g., $SnO_2$, $In_2O_3$, $ZnO$), CdO, $CdSnO_4$, ITO ($In_2O_3 + SnO_2$)) and a metal thin film made of Au, Al, or Cu. The transparent electrode 106 is formed on a p-type semiconductor layer 125 in FIG. 1. A transparent electrode 106 is formed on the substrate 101 in FIG. 2. An electrode material having a high adhesion strength with the layer 125 or the substrate 101 must be selected. The transparent electrode is formed by resistive heating deposition, electron beam heating deposition, sputtering, or spraying.

Collector Electrode

The collector electrode 107 used in the present invention is formed on the transparent electrode 106 to reduce the surface resistance of the transparent electrode 106. The collector electrode material is a thin film of a metal (e.g., Ag, Cr, Ni, Al, Ag, Au, Ti, Pt, Cu, Mo, or W) or an alloy thereof. The above thin films can be stacked on each other. The shapes and areas of these thin films are appropriately designed so that a sufficient amount of light is incident on the semiconductor layer.

For example, the shape of the thin film is uniformly designed with respect to the light-receiving surface of the photovoltaic element. The area of the thin film is preferably 15% or less and more preferably 10% or less with respect to the light-receiving area. The thin film has a sheet resistance of preferably 50 Ω/□ or less and more preferably 10 Ω/□ or less.

The semiconductor layers 103, 104, 105, 113, 114, 115, 123, 124, and 125 are formed by a conventional thin film formation process and can be arbitrarily formed using known methods such as vacuum deposition, sputtering, RF plasma CVD, microwave plasma CVD, ECR, thermal CVD, and LPCVD. Plasma CVD for decomposing a source gas to deposit a film on a substrate is most popular as an industrial method. A batch apparatus or a continuous film formation apparatus can be arbitrarily used as a reaction apparatus. When a doped semiconductor is to be prepared, $PH_3$ or $B_2H_6$ gases respectively containing phosphorus and boron are simultaneously decomposed to obtain such a semiconductor.

i-Type Semiconductor Layer

As for the middle cell of the photovoltaic element according to the present invention, examples of the semiconductor material constituting the i-type semiconductor layer are amorphous silicon germanium and amorphous silicon tin. When an amorphous silicon germanium i layer is to be formed, a so-called Group IV alloy semiconductor material such as a-SiGe:H, a-SiGe:F, or a-SiGe:H:F can be used. Examples of the semiconductor material constituting the other i-type semiconductor layers, except for the amorphous silicon germanium layer in the tandem cell structure, are the so-called Group IV and IV alloy semiconductor materials:

a-Si:H, a-Si:F, a-Si:HF,
a-SiC:H, a-SiC:F,
a-SiC:H:F, poly-Si:H,
poly-Si:F, poly-Si:H:F and so-called Group III-V and II-VI compound semiconductor materials.

A source gas used in CVD contains a chain or cyclic silane compound containing silicon. Examples of the source gas are gaseous materials or materials which can be easily gasified, such as $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $SiCl_6$, $SiHCl_3$, $SiHBr_2$, $SiH_2Cl_2$, and $Si_2Cl_3F_3$.

Compounds containing germanium are a chain germane or germanium halide compound, a cyclic germane or germanium halide compound, a chain or cyclic germanium compound, and an organic germanium compound having an alkyl group. Examples of such a compound are $GeH_4$, $Ge_2H_6$, $Ge_3H_8$, n-$GeH_{10}$, t-$Ge_4H_{10}$, $GeH_6$, $Ge_5H_{10}$, $GeH_3Cl$, $GeH_2F_2$, $Ge(CH_3)_4$, $Ge(C_2H_5)_4$, $Ge(C_6H_5)_4$, $Ge(CH_3)_2F_2$, $GeF_2$, and $GeF_4$.

P- and N-Type Semiconductor Layers

A non-monocrystalline semiconductor material constituting the p- or n-type semiconductor layer suitably used in the photovoltaic element of the present invention is an amorphous semiconductor or a microcrystalline semiconductor obtained by doping a semiconductor material constituting the i-type semiconductor layer. A method for forming the i-type semiconductor layer as described above can be suitably used as a method for forming the p- or n-type semiconductor layer. As for the material of this layer, in order to obtain a deposition film consisting of a Group IV element of the periodic table, a compound containing a Group III element of the periodic table is used as a doping agent to obtain a p-type semiconductor. Examples of the Group III element are B, Al, Ga, In, and the like. Examples of the source gas containing the Group III element are $BF_3$, $B_2H_6$, $B_4H_{10}$, $B_5H_9$, $B_5H_{11}$, $B_6H_{10}$, $B(CH_3)_3$, $B(C_2H_5)_3$, $B_6H_{12}$, $Al(CH_3)_2Cl$, $Al(CH_3)_3$, $Al(OCH_3)_2Cl$, $Al(CH_3)Cl_2$, $Al(C_2H_5)_3$, $Al(OC_2H_5)_3$, $Al(CH_3)_3Cl_3$, $Al(i-C_4H_9)_5$, $Al(C_3H_7)_3$, $Al(OC_4H_9)_3$, $Ga(OCH_3)_3$, $Ga(OC_2H_5)_3$, $Ga(OC_3H_7)_3$, $Ga(CH_3)_3$, $Ga_2H_6$, $GaH(C_2H_5)_2$, $Ga(OC_2H_5)$, $(C_2H_5)_2$, $In(CH_3)_3$, $In(C_3H_7)_3$, and $In(C_4H_9)_3$.

A compound containing a Group V element of the periodic table as a doping agent is used to obtain a n-type semiconductor. Examples of the Group V element are P, N, As, Sb, and the like. Examples of the source gas containing the Group V element are $NH_3HN_3$, $N_2H_5N_3$, $N_2H_4$, $NH_4N_3$, $PH_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_7)_3$, $P(C_4H_9)_3$, $P(OCH_2H_5)_3$, $P(OC_3H_7)_3$, $P(SCN)_3$, $P_2H_4$, $AsH_3$, $As(OCH_3)_3$, $As(OC_2H_5)_3$, $As(OC_3H_7)_3$, $As(OC_4H_9)_3$, $As(CH_3)_3$, $As(C_2H_5)_3$, $As(C_6H_5)_3$, $SbH_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, and $Sb(C_4H_9)_3$.

The above source gases may be used singly or in a combination of at least two gases.

When the source material is in a gaseous state at atmospheric pressure, the flow rate of the material supplied to a film formation space is controlled by a mass flow controller (to be referred to as an MFC hereinafter). However, when the source material is in a liquid state, a rare gas such as Ar or He or hydrogen gas is used as a carrier gas to gasify the liquid materials by a temperature-controllable bubbler. When the source material is in a solid state, a rare gas such as Ar or He or hydrogen gas is used as a carrier gas to gasify the material by means of a sublimation heating furnace. The flow rate of the material supplied to the film formation space is mainly controlled by the flow rate of the carrier gas and the furnace temperature.

In the triple cells shown in FIGS. 1 and 2, each cell is preferably formed of semiconductor layers having the following relationship between bands gaps and film thicknesses.

Top Cell

Since the i-layer band gap of the middle cell falls within the range of 1.45 eV to 1.60 eV, the i layer of the top cell preferably has a band gap larger than that of the i layer of the middle cell and a thickness smaller than that. More specifically, the film thickness falls within the range of 500 Å to 2,000 Å and the band gap falls within the range of 1.60 eV to 2.20 eV. In addition, the top cell i layer preferably consists of amorphous silicon or amorphous silicon containing at least one element selected from carbon, oxygen, and nitrogen.

Bottom Cell

The bottom cell which is formed adjacent to the middle cell and on which light which passes through the middle cell is incident preferably has a thickness larger than that of the middle cell i layer and a band gap smaller than that. More specifically, the film thickness more preferably falls within the range of 1,000 Å to 3,000 Å, and the band gap more preferably falls within the range of 1.30 eV to 1.45 eV.

The contents of carbon (C), nitrogen (N), oxygen (O), phosphorus (P), or boron (B) contained in the middle cell is preferably low. The respective concentrations of carbon, nitrogen, oxygen, phosphorus, and boron are $1 \times 10^{19}$ atoms/cm$^3$ or less, $1 \times 10^{19}$ atoms/cm$^3$ or less, $5 \times 10^{19}$ atoms/cm$^3$ or less, $1 \times 10^{19}$ atoms/cm$^3$ or less, and $2 \times 10^{17}$ atoms/cm$^3$ or less.

On the other hand, the contents of atoms such as hydrogen (H) and fluorine (F) in the middle cell are relatively high. The respective concentrations of hydrogen and a halogen are $1 \times 10^{20}$ atoms/cm$^3$ or more and $1 \times 10^{17}$ atoms/cm$^3$ or more.

The present inventors conducted the following experiments using the above materials.

EXPERIMENT 1

Figure 3:
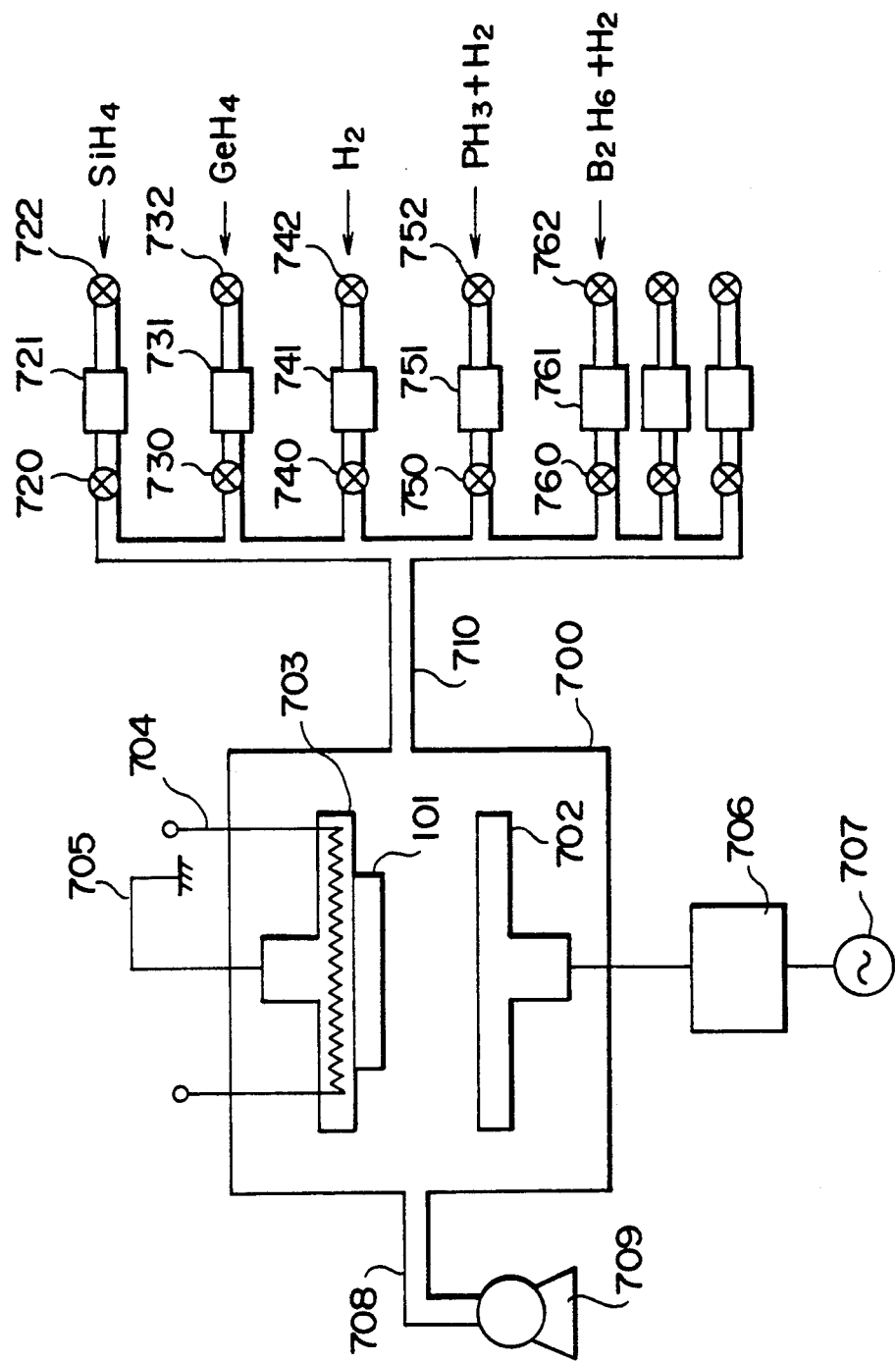
FIG. 3 is a schematic diagram showing a film forming apparatus for forming a photovoltaic element according to the present invention.

A pin solar cell using an amorphous silicon germanium i layer was formed using a known RF discharge plasma CVD apparatus shown in FIG. 3.

Referring to FIG. 3, the RF discharge plasma CVD apparatus comprises a reaction chamber 700 in which a substrate 101 is mounted, an anode electrode 702, a cathode electrode 703, a substrate heater 704, a ground terminal 705, a machine box 706, an RF power source 707, an evacuation pipe 708, an evacuation pump 709, a film formation gas supply pipe 710, valves 720, 730, 740, 750, 760, 722, 732, 742, 752, and 762, and mass flow controllers 721, 731, 741, 751, and 761.

A 5-cm square stainless steel (SUS 304) substrate 101 having a mirror surface with an $R_{max}$ value of 0.05 μm was placed in a sputtering apparatus (not shown), and the interior of the apparatus was evacuated to a vacuum of $10^{-7}$ Torr or less. Ar gas was supplied to the apparatus to set the internal pressure at 5 mTorr. A DC plasma discharge was generated at the power of 200 W. An Ag target was used to perform sputtering of an Ag deposition film having a thickness of about 5,000 Å.

Thereafter, the target was changed to a ZnO target, and a DC plasma discharge was generated under the same internal pressure and power conditions to perform sputtering, thereby depositing a ZnO film having a thickness of about 5,000 Å.

After a lower electrode 102 was formed in the above process, the substrate 101 was removed and mounted on the cathode in the reaction chamber 700. The interior of the reaction changer 700 was evacuated by the evacuation pump 709 to $10^{-6}$ Torr as determined by an ion gauge (not shown).

The substrate 101 was heated to 300° C. by the substrate heater 704. When the substrate temperature was stabilized, the valves 720 and 722 were opened. The flow rate of SiH$_4$ gas was controlled to 30 SCCM by the mass flow controller 721, and the SiH$_4$ gas was supplied from a SiH$_4$ gas tank (not shown) to the reaction chamber 700 through the gas supply pipe 710.

Similarly, the valves 740 and 742 were opened, and the flow rate of H$_2$ gas was controlled to be 300 SCCM by the mass flow controller 741. The valves 750 and 752 were opened, and the flow rate of PH$_3$ gas diluted to 5% by H$_2$ gas was controlled to 10 SCCM.

After the internal pressure of the reaction chamber 700 was set at 1.5 Torr, 10-W of power was supplied from the RF power source 707 to the reaction chamber 700 through the matching box 706. A plasma discharge was performed for three minutes to deposit phosphorus-doped hydrogenated amorphous silicon 103 as the n-type monocrystalline silicon layer.

After the gas supply was interrupted, the reaction chamber 700 was evacuated again. The degree of vacuum in the reaction chamber 700 was set at $10^{-6}$ Torr or less. The valves 720, 722, 730, 732, 740, and 742 were opened to supply SiH$_4$ gas, H$_2$ gas, and GeH$_4$ gas respectively having flow rates of 30 SCCM, 300 SCCM, and 5 SCCM to the reaction chamber 700.

20-W of power was then supplied from the RF power source 707 to generate a plasma discharge, and film formation was performed for 5 minutes, thereby depositing a hydrogenated amorphous silicon germanium i layer 104 consisting of amorphous silicon germanium having a thickness of about 600 Å. The response speed of the mass flow controller 731 was sufficiently high, and the flow rate was immediately set within one second without overshooting. Error in the set flow rate fell within the range of ±2%. A pressure controller (not shown) was used to prevent a variation in pressure caused by a variation in flow rate. Flow control of the mass flow controller 731 was accurately performed by a microcomputer. The band gap of the amorphous silicon germanium film deposited under the above conditions was confirmed to be 1.53 eV in advance in accordance with a sample deposited on a glass substrate.

The flow rate then was set to be 0 SCCM by the mass flow controller. The valves 720, 722, 730, 732, 740, and 742 were closed to instantaneously set the flow rates of the GeH$_4$ gas, the SiH$_4$ gas, and the H$_2$ gas to 0 SCCM. The RF power was set to 0 W to interrupt the plasma discharge, and gas supply was interrupted. The degree of vacuum of the reaction chamber 700 was set at 10$^{-6}$ Torr or less. The valves 720, 722, 730, 732, 740, and 742 were opened to supply SiH$_4$ gas, H$_2$ gas, and B$_2$H$_6$ gas diluted to 5% with H$_2$ gas, respectively at flow rates of 1 SCCM, 300 SCCM, and 10 SCCM, to the reaction chamber 700.

20-W of power was then supplied from the RF power source 707 to generate a plasma discharge, and film formation was performed for 5 minutes to deposit a 100-Å thick p-type layer 105, thereby forming the bottom cell. The p-type layer deposited under the above conditions was confirmed as boron-doped hydrogenated microcrystalline silicon having a grain size falling within the range of 20 Å to 100 Å by reflection high-speed electron beam diffraction (RHEED) from a sample deposited on a glass substrate.

After the substrate 101 was cooled, it was unloaded from the reaction chamber 700. The substrate 101 was then placed in a resistive heating deposition apparatus (not shown). The interior of the apparatus was evacuated to 10$^{-7}$ Torr or less, and the internal pressure was set at 0.5 m Torr. An alloy of In and Sn was deposited by resistive heating, thereby depositing a 700-Å thick transparent conductive film (ITO film) also having an antireflection function. This film was defined as an upper electrode 106.

Upon completion of deposition, the sample was removed and divided into subcells each having a size of 1 cm × 1 cm by a dry etching apparatus (not shown). The subcells were transferred to another deposition apparatus, and aluminum collector electrodes 107 were formed by electron beam deposition. The resultant solar cell is defined as S-1.

Film formation was performed following the same procedures as described above except that the deposition periods were set to be 10, 15, 20, and 25 minutes. The resultant samples are defined as S-2, S-3, S-4, and S-5.

These samples were placed on a temperature-controllable sample table, and the temperature was maintained at 25° C. The upper electrodes 106 of the samples were irradiated with light having AM-1.5 sunlight spectra having an intensity of 100 mW/Cm$^2$ by using a pseudo solar source (to be referred to as a solar simulator) using a xenon lamp as a light source. The current/voltage characteristics of the samples were measured to obtain initial conversion efficiencies $\eta(0)$ of the solar cells.

Optical degradation characteristics of these samples were evaluated as follows.

Optical loads were calculated from open circuit voltages Voc and short-circuit current Isc derived from the above current/voltage characteristics, and load resistors were respectively connected to the samples.

Figure 4:
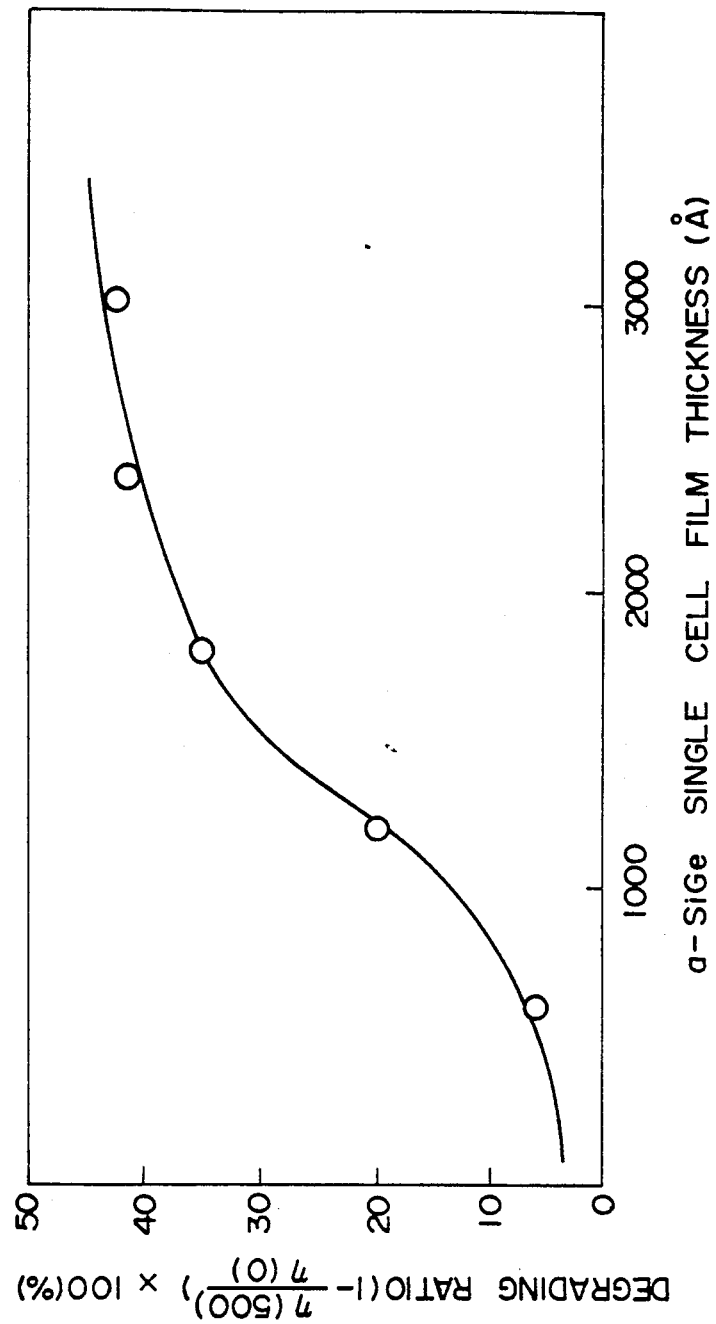
FIG. 4 is a graph showing the relationship between the i-layer film thickness of an amorphous silicon germanium single cell and the degrading ratio.

The samples connected to the load resistors were placed on the sample table kept at 25° C., and the AM-1.5 light described above (100 mW/cm$^2$) was continuously radiated on the samples for 500 hours. Optical conversion efficiencies $\eta(500)$ of the samples irradiated with the AM-1.5 light (00 mW/cm$^2$) from the side of the upper electrodes 106 were obtained following the same procedures as described above. The degradation ratios $[1-\eta(500/\eta(0)] \times 100$ (%) were obtained from $\eta(500)$ and $\eta(0)$ obtained in this manner. Results are shown in FIG. 4. As can be seen from FIG. 4, solar cell characteristics can be stable upon light radiation when the thickness of the i layer is smaller.

EXPERIMENT 2

Figure 5:
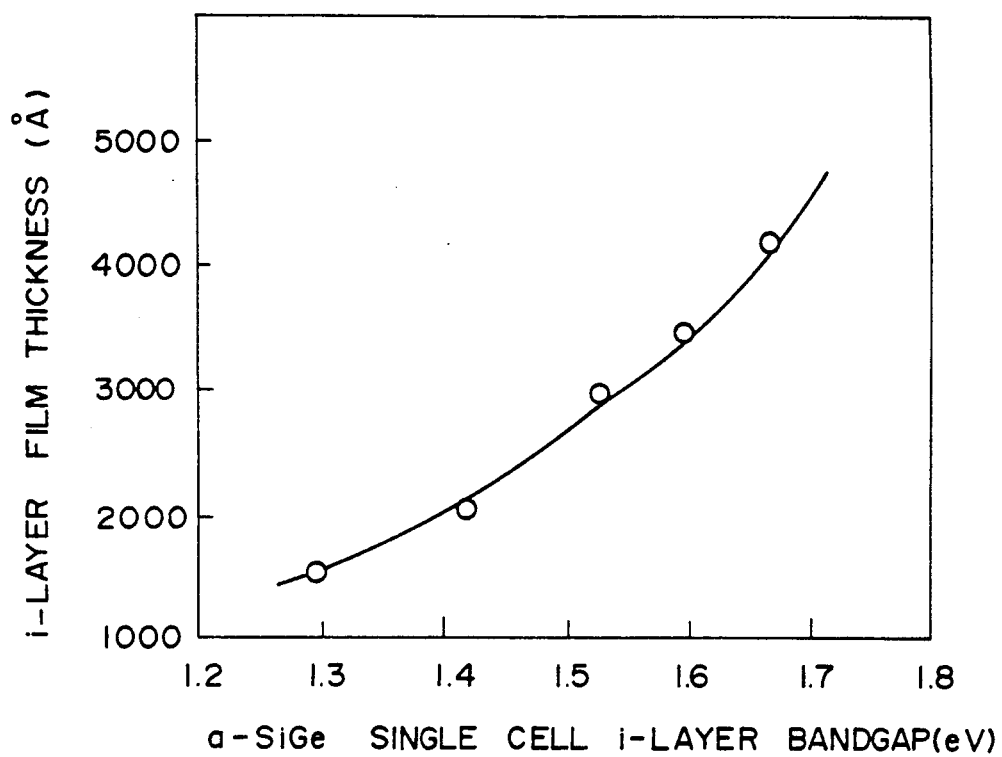
FIG. 5 is a graph showing the relationship between the i-layer band gap of the amorphous silicon germanium single cell and the i-layer film thickness.

The flow rate of the GeH$_4$ gas during formation of the i film was changed to vary the band gap between 1.67 eV, 1.60 eV, 1.42 eV, and 1.30 eV. Solar cells having appropriate film thicknesses were obtained so that their short-circuit currents Jsc were equal to that of sample S-1 of Experiment 1. The resultant samples were defined as S-6, S-7, S-8, and S-9. The relationship between the bands gaps and the film thicknesses of the samples is shown in FIG. 5. It is readily understood from FIG. 5 that the thickness of the i layer required to obtain the same short-circuit current becomes small when the band gap of the i layer is smaller.

Figure 6:
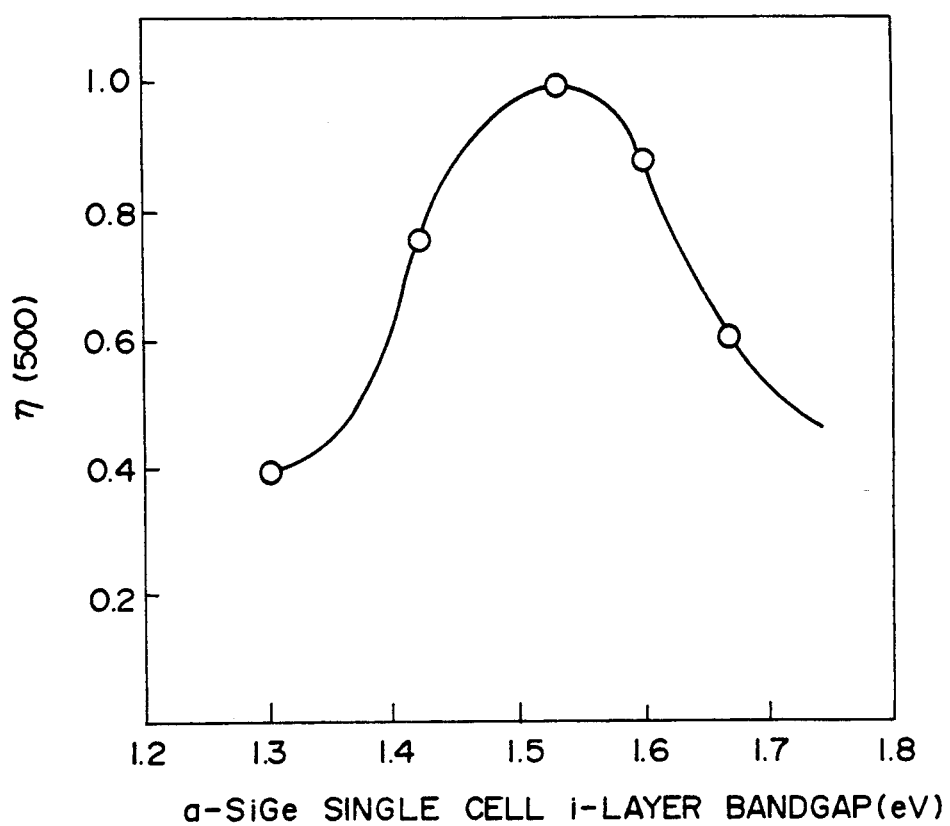
FIG. 6 is a graph showing the relationship between the i-layer band gap of the amorphous silicon geranium single cell and the conversion efficiency after degradation.

Conversion efficiencies $\eta(500)$ of samples S-6 to S-9, and S-1 upon light radiation for 500 hours were obtained following the same procedures as in Experiment 1, and the results are shown in FIG. 6. It is apparent from the results shown in FIG. 6, assuming that the maximum $\eta(500)$ value is 1, that the conversion efficiency upon optical degradation can be increased when the band gap of the i layer is in the range from 1.45 eV to 1.6 eV. This result may lead to the following conclusion. When the band gap of the i layer is decreased, the short-circuit current is increased, and the film thickness can be reduced, thereby suppressing optical degradation. However, when the band gap of the i layer is decreased, the open voltage is lowered and the film quality is also degraded. The fill factor of the solar cell characteristics may also be decreased.

It is therefore easily understood that optimal design can be performed by the trade-off relationship between the degradation prevention effect by a decrease in thickness of the i layer and the decrease in initial conversion efficiency.

Extensive studies have been made by the present inventors on the basis of the above experiments. The present inventors have thus achieved the present invention by optimally designing the amorphous silicon germanium layer used in a triple cell.

EXAMPLE 1

A triple cell according to the present invention was manufactured using the CVD film formation apparatus shown in FIG. 3. After a lower electrode 102 was formed following the same procedures as in Experiment 1, substrate 101 was removed from the formation apparatus. The substrate 101 was then mounted on the cathode in the reaction chamber 700, and the reaction chamber was sufficiently evacuated by the evacuation pump 709 The degree of vacuum of the reaction chamber 700 was set at 10$^{-6}$ Torr by an ion gauge (not shown). The substrate 101 was heated to 300° C. by the substrate heater 704, and a 400-Å thick n-type amorphous silicon layer 103 was deposited following the same procedures as in Experiment 1.

After the gas supply was interrupted, the reaction chamber 700 was evacuated again. The degree of vacuum of the reaction chamber 700 was set at 10$^{-6}$ Torr or less. The valves 720, 722, 730, 732, 740, and 742 were opened to supply SiH$_4$ gas, H$_2$ gas, and GeH$_2$ gas respectively having flow rates of 30 SCCM, 300 SCCM, and 5.0 SCCM to the reaction chamber 700. 20-W of power was supplied from the RF power source 707 to generate a plasma discharge. Film formation was performed for 30 minutes to deposit a non-doped amorphous silicon germanium i layer 104 having a thickness of about 1,800 Å. The band gap of the amorphous silicon germanium film deposited under the above conditions was confirmed to be about 1.53 eV in advance, as described in Experiment 1. A boron-doped hydrogenated microcrystalline silicon layer 105 containing a p-type impurity was deposited to a thickness of 100 Å following the same procedures as in Experiment 1, thereby forming a bottom cell.

An n-type layer 113 was then formed as for the n-type layer of the bottom cell, and a 1,000-Å thick i layer 114 was deposited following the same procedures as described above except that the flow rate of the GeH$_4$ gas was set to be 2.5 SCCM. The band gap of the non-doped hydrogenated amorphous silicon germanium film deposited under the above conditions was confirmed to be about 1.60 eV from a sample deposited on a substrate.

A boron-doped hydrogenated microcrystalline silicon layer 115 was deposited to form a middle cell following the same procedures as in Experiment 1.

After an n-type layer 123 was formed as for the n-type layer of the bottom cell, SiH$_4$ gas having a flow rate of 30 SCCM and H$_2$ gas having a flow rate of 300 SCCM were supplied to the reaction chamber, and 20-W of power was supplied thereto to deposit a 700-Å thick non-doped hydrogenated amorphous silicon i layer 124. A p-type layer 125 was deposited thereon as for the p-type layer of the bottom cell, thereby forming a top cell.

After the substrate 101 was cooled, it was removed from the reaction chamber 700. A 700-Å thick transparent conductive film (ITO film) was deposited following the same procedures as in Experiment 1, and this deposition film was defined as an upper electrode 106. The sample was then removed from the reaction chamber. The sample was divided into subcells each having a size of 1 cm×1 cm by a dry etching apparatus (not shown). The subcells were places in another deposition apparatus, and aluminum collector electrodes 107 were formed by electron beam deposition. The resultant solar cell was defined as sample No. 1-1.

Samples were formed following the same procedures as described above except that the band gaps and deposition periods of the i films 114 were changed. The resultant samples were defined as Nos. 1-2, 1-3, 1-4, 1-5, and 1-6. In addition, sample R-1 having an amorphous silicon i layer 114 was also formed.

These samples were irradiated with AM-1.5 light having an intensity of 100 mW/cm$^2$ by using the solar simulator, and voltage vs. current curves were obtained to measure initial conversion efficiencies of the solar cells.

Figure 7:
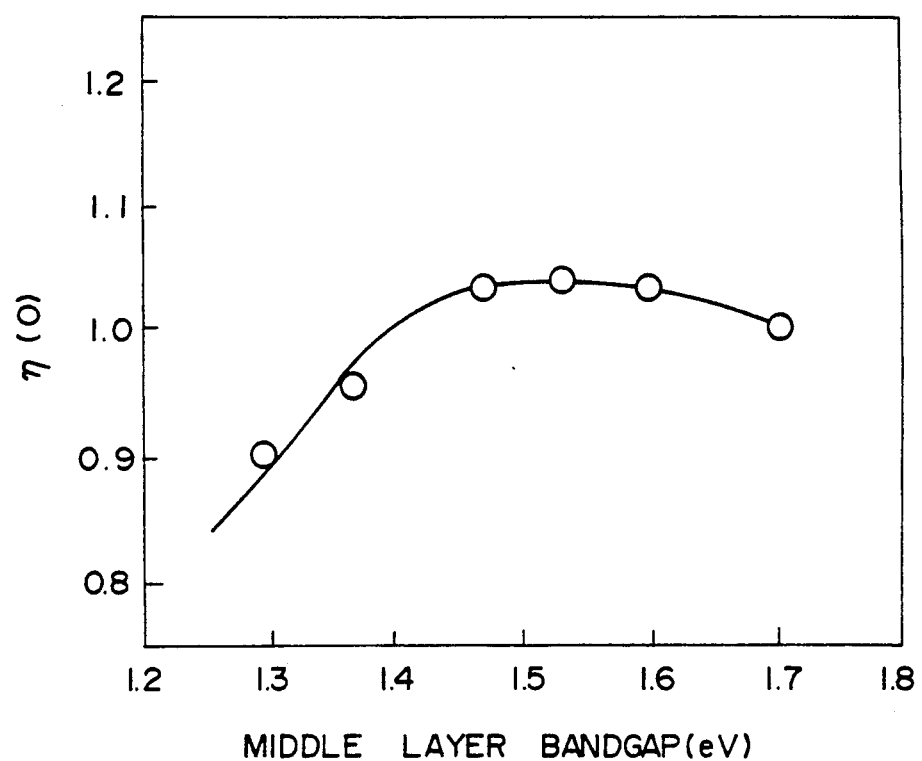
FIG. 7 is a graph showing the relationship between the middle cell i-layer band gap of a triple cell and the initial conversion efficiency.

The results are shown in FIG. 7. Conversion efficiency $\eta(0)$ was normalized by defining the conversion efficiency $\eta_R(0)$ of sample R-1 as 1. Optical degradation measurement was performed following the same procedures as in Experiment 2 by using AM-1.5 light (100 mW/cm$^2$) to obtain conversion efficiencies $\eta(500)$ after 500 hours. Results of the efficiencies normalized with the efficiency $\eta_R(500)$ of sample R-1 as 1 are shown in FIG. 8.

Figure 8:
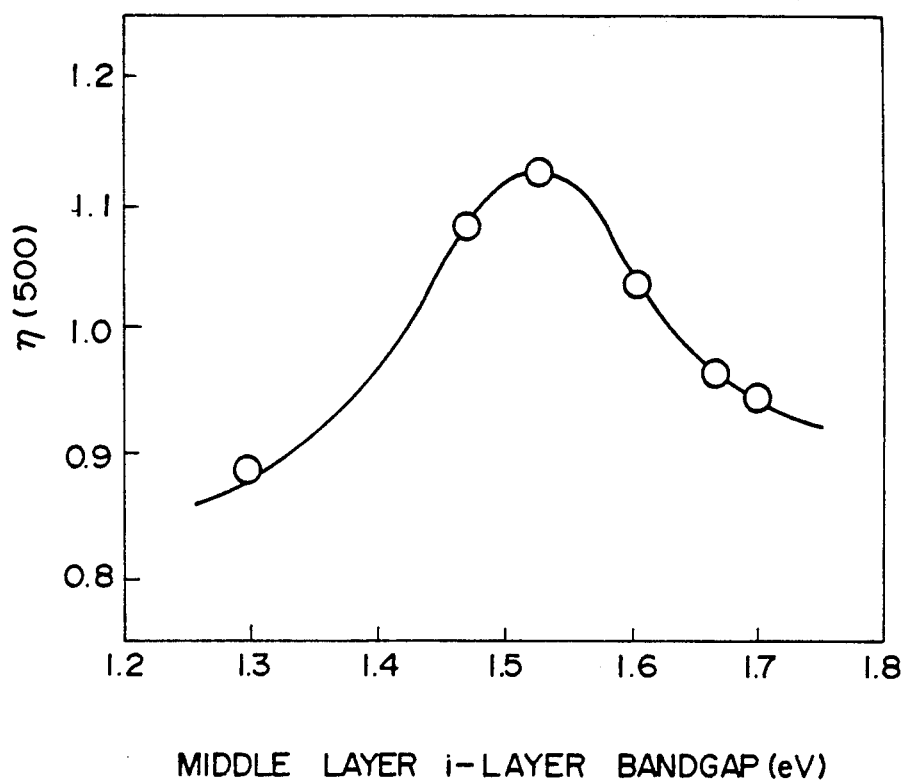
FIG. 8 is a graph showing the relationship between the middle cell i-layer band gap of the triple cell and the conversion efficiency after degradation.

As can be seen from FIGS. 7 and 8, when the band gap of the middle cell is within the range of 1.45 eV to 1.60 eV, a solar cell having a high conversion efficiency can be obtained.

Triple cells having different middle cell i layers made by changing the band gap of the i layer of the bottom cells to 1.3 eV, 1.45 ev, and 1.60 eV were also prepared.

Figure 9:
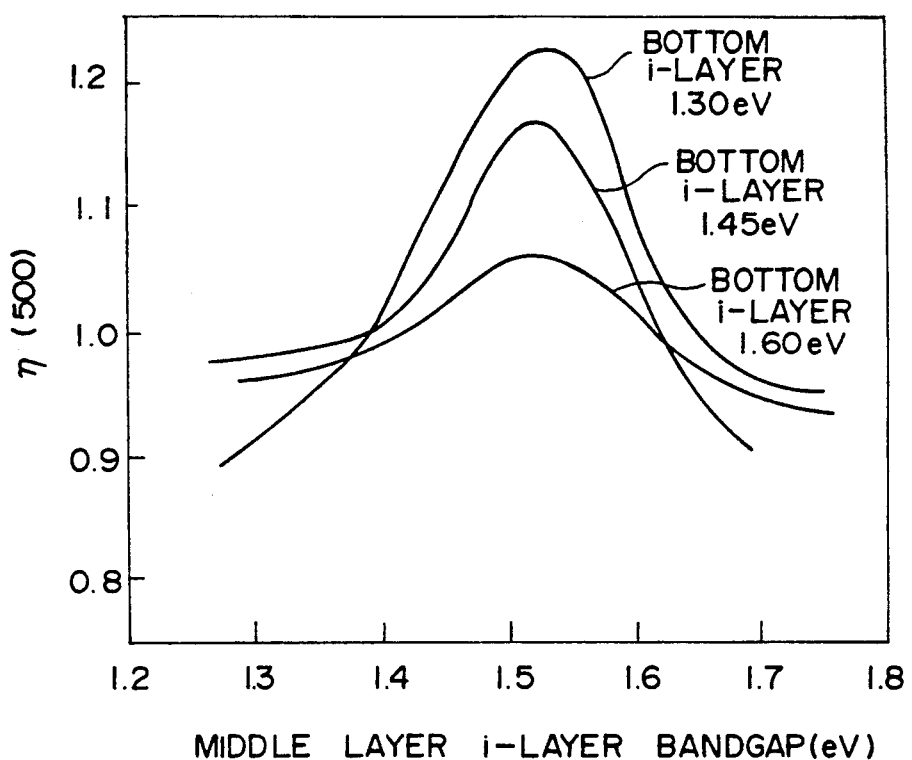
FIG. 9 is a graph showing the relationship between the middle cell i-layer band gap of the triple cell and the conversion efficiency after degradation when the bottom cell i-layer band gap of the triple cell is changed.

Conversion efficiencies $\eta(500)$ of these samples after 500 hours upon optical degradation were obtained following the same procedures as in Experiment 2 and were normalized using the efficiency $\eta_R(500)$ of sample R-1 as 1. Results are shown in FIG. 9. As is apparent from FIG. 9, the band gap of the i layer of the middle cell again preferably falls within the range of 1.45 eV to 1.60 eV.

EXAMPLE 2

A solar cell having the structure shown in FIG. 2 obtained by depositing triple cells on a glass substrate was formed using the film formation apparatus in FIG. 3.

The surface of a 5-cm square quartz glass substrate 101 was mirror-finished to obtain an R$_{max}$ value of 0.05 $\mu$m, and a 3,00-Å thick SnO$_2$ film was deposited on the substrate using a deposition apparatus (not shown), thereby forming the upper electrode 106.

The substrate 101 was removed and mounted on the cathode of the reaction chamber 700, and the chamber was sufficiently evacuated by the evacuation pump 709. The degree of vacuum of the reaction chamber 700 was set at 10$^{-6}$ Torr by an ion gauge (not shown).

The substrate 101 was heated to 300° C. by the substrate heater 704. When the substrate temperature was stabilized, a 100-Å thick p-type boron-doped hydrogenated microcrystalline silicon layer 123 was formed following the same procedures as in Example 1.

Upon completion of the above, the reaction chamber 700 was evacuated again, so that the degree of vacuum of the reaction chamber 700 was set at 10$^{-6}$ Torr. SiH$_4$ and H$_2$ gases respectively having flow rates of 30 SCCM and 300 SCCM were supplied to the reaction chamber 700, and 20-W of power was supplied from the RF power source 707, thereby generating a plasma discharge. Film formation was performed for 10 minutes to deposit a non-doped hydrogenated amorphous silicon i layer 124 having a thickness of about 600 Å.

An n-type layer 125 was deposited to form a top cell 122 located on the light incident side.

After boron-doped hydrogenated microcrystalline silicon was deposited as a p-type layer 113 following the same procedures as in Example 1, hydrogenated amorphous silicon germanium 114 as the i layer having a band gap of 1.60 eV was deposited to have a thickness of 1,000 Å at a flow rate of 2.5 SCCM of GeH$_4$ gas as in Example 1. An n-type layer 115 was deposited to form a middle cell 121.

After a p-type layer 103 was deposited in the top and middle cells, a 1,800-Å thick hydrogenated amorphous silicon germanium i layer 104 having a band gap of 1.53 eV was deposited at a flow rate of 5 SCCM of the GeH$_4$ gas as in Example 1, and an n-type layer 105 was formed, thereby forming a bottom cell 120.

After the substrate 101 was cooled, it was removed from the reaction chamber 700 and was placed in a resistive heating deposition apparatus (not shown). Aluminum was deposited to a thickness of 5,000 Å to form a lower electrode 102. Upon completion of deposition, the sample was removed and divided into subcells each having a size of 1 cm×1 cm by a dry etching apparatus (not shown). The resultant solar cell was defined as sample No. 2-1.

This sample was irradiated with AM 1.5 light having an intensity of 100 mW/cm$^2$ by using the solar simulator, and the voltage vs. current curve was obtained to measure the initial conversion efficiency $\eta(0)$ of the solar cell.

Optical degradation characteristics of these samples were measured following the same procedures as in Example 1 to obtain conversion efficiencies $\eta(500)$. Results are listed in the following table. These results are normalized by using the conversion efficiency $\eta_R(500)$ of sample R-1 as 1.

EXAMPLE 3

Film formation was performed by changing film formation gases and film formation conditions of the middle cells shown in the following table to prepare solar cell samples each having the triple structure shown in FIG. 1. The same conditions for the top and bottom cells as in Example 1 were used, and the film formation apparatus shown in FIG. 3 was also used. The resultant samples were defined as sample Nos. 3-1, 3-2, 3-3, and 3-4.

TABLE

| Sample No. | i Layer Formation Condition of Middle Layer | Middle i-Layer Band Gap | Initial Efficiency $\eta(0)/\eta_R(0)$ | Efficiency After 500 Hours $\eta(500)/\eta_R(500)$ |
| --- | --- | --- | --- | --- |
| 2-1 | SiH$_4$ 30 SCCM<br>GeH$_4$ 5 SCCM<br>H$_2$ 300 SCCM<br>RF power 20 W | 1.53 eV | 1.15 | 1.25 |
| 3-1 | Si$_2$H$_6$ 10 SCCM<br>GeH$_4$ 5 SCCM<br>H$_2$ 100 SCCM<br>RF power 10 W | 1.53 eV | 1.20 | 1.30 |
| 3-2 | SiF$_4$ 50 SCCM<br>GeH$_4$ 5 SCCM<br>H$_2$ 500 SCCM<br>RF power 50 W | 1.45 eV | 1.01 | 1.10 |
| 3-3 | Si$_2$F$_6$ 30 SCCM<br>GeF$_4$ 5 SCCM<br>H$_2$ 300 SCCM<br>RF power 30 W | 1.60 eV | 1.00 | 1.15 |
| 3-4 | SiF$_4$ 20 SCCM<br>GeF$_4$ 5 SCCM<br>H$_2$ 30 SCCM<br>RF power 50 W | 1.53 eV | 1.05 | 1.15 |

These samples were irradiated with AM-1.5 light having an intensity of 100 mw/cm$^2$ by using the solar simulator to obtain voltage vs. current curves, thereby measuring the initial conversion efficiencies $\eta(0)$ of the solar cell samples.

The optical degradation characteristics of these samples were measured following the same procedures as in Example 1, thereby obtaining the conversion efficiencies $\eta(500)$, and the results are shown in the above table. The results are normalized by using the conversion efficiency $\eta_R(500)$ of sample R-1 as 1.

As is apparent from the above table, in each triple cell, amorphous silicon germanium having a band gap falling within the range of 1.45 eV to 1.60 eV is used as the i layer of the middle cell to obtain a high initial conversion efficiency and a high conversion efficiency after degradation.

According to the examples of the present invention, in a multi-layered photovoltaic element having three stacked pin photovoltaic elements, the i-type semiconductor layer of the photovoltaic element located at the center consists of an amorphous silicon germanium alloy semiconductor having a band gap falling within the range of 1.45 eV to 1.60 eV. Therefore a photoelectric conversion apparatus having a high conversion efficiency after degradation and a high initial conversion efficiency can be obtained.

What is claimed is:

1. A multi-layered photovoltaic device comprising:
   a substrate having a surface pattern which has a maximum height falling within a range of 500 Å to 5,000 Å to cause irregular reflection at said surface;
   a first photovoltaic cell on said surface of said substrate having an i-type semiconductor layer having a band gap falling within a range of 1.3 eV to 1.45 eV and a thickness falling within a range of 1,000 Å to 3,000 Å;
   a second photovoltaic cell on said first photovoltaic cell including an i-type semiconductor layer having a band gap falling within a range of 1.45 eV to 1.60 eV and a thickness smaller than that of said i-type semiconductor layer of said first photovoltaic cell, said i-type semiconductor layer consisting essentially of a silicon germanium-containing amorphous material;
   a third photovoltaic cell on said second photovoltaic cell including an i-type semiconductor layer having a band gap falling within a range of 1.6 eV to 2.2 eV and a thickness smaller than that of said i-type semiconductor layer of said second photovoltaic cell, said thickness falling within a range of 500 Å–2,000 Å; and
   a transparent electrode on said third photovoltaic cell providing a light incident surface.

* * * * *

UNITED STATES PATENT AND TRADEMARK OFFICE
CERTIFICATE OF CORRECTION

PATENT NO. : 5,279,679
DATED : January 18, 1994
INVENTOR(S) : TSUTOMU MURAKAMI ET AL.          Page 1 of 2

It is certified that error appears in the above-indentified patent and that said Letters Patent is hereby corrected as shown below:

<u>TITLE PAGE</u>

<u>ITEM [56] REFERENCES CITED</u>

Foreign Patent Documents,
"62-084571  9/1987  Japan" should read
--62-084571  4/1987  Japan--.

Attorney, Agent, or Firm,
"Fitzpatrick, Cella Harper & Scinto" should read
--Fitzpatrick, Cella, Harper & Scinto--.

<u>COLUMN 7</u>

Line 22, "$In_2O_3$," should read --$In_2O_3$,--.

<u>COLUMN 12</u>

Line 53, "709" should read --709.--.

<u>COLUMN 13</u>

Line 38, "places" should read --placed--.

UNITED STATES PATENT AND TRADEMARK OFFICE
CERTIFICATE OF CORRECTION

PATENT NO. : 5,279,679
DATED : January 18, 1994
INVENTOR(S) : TSUTOMU MURAKAMI ET AL.　　　Page 2 of 2

It is certified that error appears in the above-indentified patent and that said Letters Patent is hereby corrected as shown below:

<u>COLUMN 14</u>

Line 17, "3,00-Å thick" should read --3,000-Å thick--.

Signed and Sealed this

Twenty-third Day of August, 1994

Attest:

BRUCE LEHMAN

*Attesting Officer*　　　*Commissioner of Patents and Trademarks*